US012652945B2

(12) United States Patent
Chen et al.

(10) Patent No.: US 12,652,945 B2
(45) Date of Patent: Jun. 9, 2026

(54) FLEXIBLE DISPLAY SUBSTRATE INCLUDING LEVELING LAYER

(71) Applicants: Chengdu BOE Optoelectronics Technology Co., Ltd., Sichuan (CN); BOE TEchnology Group Co., Ltd., Beijing (CN)

(72) Inventors: Liqiang Chen, Beijing (CN); Shuquan Yang, Beijing (CN); Yixiang Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 545 days.

(21) Appl. No.: 18/021,538

(22) PCT Filed: Mar. 16, 2022

(86) PCT No.: PCT/CN2022/081274
§ 371 (c)(1),
(2) Date: Feb. 15, 2023

(87) PCT Pub. No.: WO2023/173340
PCT Pub. Date: Sep. 21, 2023

(65) Prior Publication Data
US 2024/0268211 A1      Aug. 8, 2024

(51) Int. Cl.
H10K 77/10 (2023.01)
H10K 59/12 (2023.01)
(Continued)

(52) U.S. Cl.
CPC ....... H10K 77/111 (2023.02); H10K 59/1201 (2023.02); H10K 59/873 (2023.02);
(Continued)

(58) Field of Classification Search
CPC .............. H10K 77/111; H10K 59/873; H10K 59/8791; H10K 59/12; H10K 59/40; G09F 1/1652; G09F 9/30; G09F 9/301
See application file for complete search history.

(56) References Cited

U.S. PATENT DOCUMENTS 10,333,087 B2 * 6/2019 Choi .................... H10K 59/131
12,457,861 B2 * 10/2025 Choi .................... H10K 59/122
(Continued)

FOREIGN PATENT DOCUMENTS

CN        105742322 A      7/2016
CN        206650079 U      11/2017
(Continued)

*Primary Examiner* — Ida M Soward
(74) *Attorney, Agent, or Firm* — IPro, PLLC

(57) ABSTRACT

A flexible display substrate includes: a flexible substrate, a display function layer at a side of the flexible substrate, a film packaging layer at a side of the display function layer facing away from the flexible substrate, and a leveling layer at a side of the film packaging layer facing away from the flexible substrate, where the flexible substrate includes a non-bending area and a bending area, the leveling layer is at least located in the bending area, and the leveling layer is configured to compensate for a height difference between a related film layer structure in the non-bending area and a related film layer structure in the bending area.

12 Claims, 10 Drawing Sheets

(51) Int. Cl.
> *H10K 59/80* (2023.01)
> *G06F 1/16* (2006.01)
> *G09F 9/30* (2006.01)
> *H10K 59/40* (2023.01)
> *H10K 102/00* (2023.01)

(52) U.S. Cl.
> CPC ....... *H10K 59/8791* (2023.02); *G06F 1/1652* (2013.01); *G09F 9/301* (2013.01); *H10K 59/12* (2023.02); *H10K 59/40* (2023.02); *H10K 2102/311* (2023.02)

(56) References Cited

U.S. PATENT DOCUMENTS

| | | | |
|---|---|---|---|
| 2016/0190503 A1 | 6/2016 | Chang et al. | |
| 2017/0294620 A1* | 10/2017 | Park | G02F 1/136209 |
| 2018/0040672 A1* | 2/2018 | Park | H10K 59/40 |
| 2018/0062090 A1* | 3/2018 | Kim | H10K 50/846 |
| 2018/0122871 A1* | 5/2018 | Choi | G06F 3/0446 |
| 2020/0243618 A1* | 7/2020 | Song | H10K 59/88 |
| 2021/0157432 A1* | 5/2021 | Lee | G06F 3/04166 |
| 2021/0200363 A1* | 7/2021 | Lee | H10K 59/121 |
| 2021/0202591 A1 | 7/2021 | Tian et al. | |
| 2021/0202868 A1* | 7/2021 | Paek | H10K 59/12 |
| 2021/0408501 A1 | 12/2021 | Yu et al. | |
| 2022/0123076 A1* | 4/2022 | Kim | H10K 59/121 |
| 2022/0164051 A1* | 5/2022 | Lee | H10K 50/844 |
| 2022/0199945 A1* | 6/2022 | Oh | G09G 3/035 |
| 2022/0344603 A1* | 10/2022 | Um | H10K 71/00 |

FOREIGN PATENT DOCUMENTS

| | | | | |
|---|---|---|---|---|
| CN | 109728004 A | | 5/2019 | |
| CN | 110620187 A | | 12/2019 | |
| CN | 111370442 A | * | 7/2020 | ............ H10K 50/84 |
| CN | 111740030 A | | 10/2020 | |

* cited by examiner

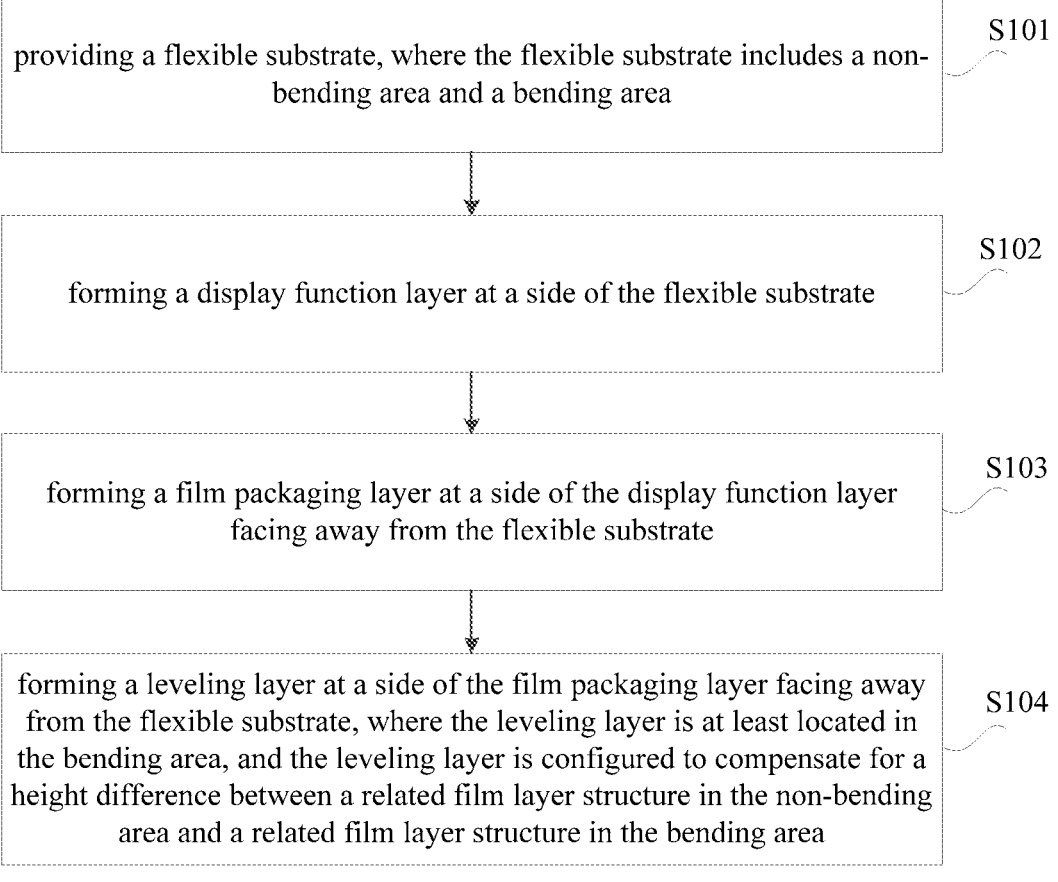

providing a flexible substrate, where the flexible substrate includes a non-bending area and a bending area    S101 forming a display function layer at a side of the flexible substrate    S102 forming a film packaging layer at a side of the display function layer facing away from the flexible substrate    S103 forming a leveling layer at a side of the film packaging layer facing away from the flexible substrate, where the leveling layer is at least located in the bending area, and the leveling layer is configured to compensate for a height difference between a related film layer structure in the non-bending area and a related film layer structure in the bending area    S104

Fig. 14

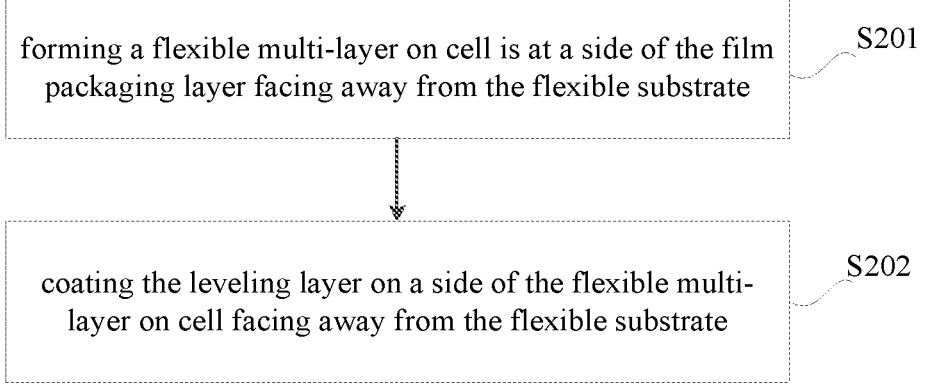

forming a flexible multi-layer on cell is at a side of the film packaging layer facing away from the flexible substrate    S201 coating the leveling layer on a side of the flexible multi-layer on cell facing away from the flexible substrate    S202

Fig. 15

FLEXIBLE DISPLAY SUBSTRATE INCLUDING LEVELING LAYER

CROSS REFERENCE TO RELATED APPLICATIONS

The present disclosure is a national phase entry under 35 U.S.C § 371 of International Application No. PCT/CN2022/081274, filed Mar. 16, 2022, and entitled "FLEXIBLE DISPLAY SUBSTRATE AND MANUFACTURING METHOD THEREFOR, AND DISPLAY APPARATUS".

FIELD

The present disclosure relates to the field of display, and particularly relates to a flexible display substrate and a manufacturing method therefor, and a display apparatus.

BACKGROUND

A flexible display screen has been widely used for its bendability and deformability. However, since water and oxygen are likely to corrode an organic light-emitting diode (OLED) device in the flexible display screen shorten its service life, a film packaging structure with multiple alternating inorganic layers and organic layers is used to isolate water and oxygen and protect the OLED device.

In a process of manufacturing a flexible display screen, a thickness difference between related film layer structures of a non-bending area and a bending area is considerable, and a segment difference between the non-bending area and the bending area is considerable accordingly, such that an uppermost inorganic layer of the film packaging structure is highly likely to get broken in a bending process, which causes packaging failure and further damages the OLED device.

SUMMARY

The present disclosure provides a flexible display substrate and a manufacturing method therefor, and a display apparatus, so as to prolong service life of the flexible display substrate.

In a first aspect, embodiments of the present disclosure provide a flexible display substrate. The flexible display substrate includes:

a flexible substrate, a display function layer at a side of the flexible substrate, a film packaging layer at a side of the display function layer facing away from the flexible substrate, and a leveling layer at a side of the film packaging layer facing away from the flexible substrate, where the flexible substrate includes a non-bending area and a bending area, the leveling layer is at least located in the bending area, and the leveling layer is configured to compensate for a height difference between a related film layer structure in the non-bending area and a related film layer structure in the bending area.

In a possible implementation mode, the flexible display substrate further includes: a flexible multi-layer structure at a side of the film packaging layer facing away from the flexible substrate, where the leveling layer is located at a side of the flexible multi-layer structure facing away from the flexible substrate, and the flexible multi-layer structure is used to implement a touch function of the flexible display substrate.

In a possible implementation mode, the leveling layer is only located in the bending area, and a surface of a side of the leveling layer facing away from the flexible substrate is flush with a surface of a side of the flexible multi-layer structure facing away from the flexible substrate in the bending area.

In a possible implementation mode, the leveling layer is made of cured ultraviolet (UV) curing adhesive or thermo-curing adhesive.

In a possible implementation mode, the leveling layer is located in both the non-bending area and the bending area, and a surface of a side of the leveling layer facing away from the flexible substrate in the non-bending area is flush with a surface of a side of the leveling layer facing away from the flexible substrate in the bending area.

In a possible implementation mode, the leveling layer is made of cured transparent optical adhesive.

In a possible implementation mode, a modulus of the cured leveling layer is greater than 100 Mpa.

In a possible implementation mode, the flexible display substrate further includes: a flexible multi-layer structure at a side of the film packaging layer facing away from the flexible substrate, where the leveling layer is disposed between the flexible multi-layer structure and the film packaging layer.

In a possible implementation mode, the leveling layer is located in both the non-bending area and the bending area, and a surface of a side of the leveling layer facing away from the flexible substrate in the non-bending area is flush with a surface of a side of the leveling layer facing away from the flexible substrate in the bending area.

In a possible implementation mode, the leveling layer is made of an organic film packaging material.

In a possible implementation mode, the flexible display substrate further includes: a barrier dam at a side of the leveling layer facing away from the display function layer, where the barrier dam is arranged around the leveling layer.

In a possible implementation mode, an edge of a side of the bending area away from the non-bending area is provided with a cutting path; and the leveling layer fills the cutting path, or the leveling layer does not cover the cutting path.

In a second aspect, the embodiments of the present disclosure further provide a display apparatus, which includes the flexible display substrate according to any one described above.

In a possible implementation mode, the display apparatus further includes: a filter layer on the flexible display substrate.

In a possible implementation mode, the filter layer is a polarizer or a color filter.

In a third aspect, the embodiments of the present disclosure further provide a manufacturing method for the flexible display substrate according to any one described above. The method includes:

providing a flexible substrate, where the flexible substrate includes a non-bending area and a bending area;

forming a display function layer at a side of the flexible substrate;

forming a film packaging layer at a side of the display function layer facing away from the flexible substrate; and forming a leveling layer at a side of the film packaging layer facing away from the flexible substrate;

the leveling layer is at least located in the bending area, and the leveling layer is configured to compensate for a height difference between a related film layer structure in the non-bending area and a related film layer structure in the bending area.

In a possible implementation mode, the forming the leveling layer at the side of the film packaging layer facing away from the flexible substrate includes:

forming a flexible multi-layer structure at a side of the film packaging layer facing away from the flexible substrate; and coating the leveling layer on a side of the flexible multi-layer structure facing away from the flexible substrate.

In a possible implementation mode, the forming the leveling layer at the side of the film packaging layer facing away from the flexible substrate includes:

printing an organic film packaging material on a side of the film packaging layer facing away from the flexible substrate by using an ink jet printing process, to form the leveling layer, where the leveling layer is located in both the non-bending area and the bending area, and a surface of a side of the leveling layer facing away from the flexible substrate in the non-bending area is flush with a surface of a side of the leveling layer facing away from the flexible substrate in the bending area.

BRIEF DESCRIPTION OF THE DRAWINGS

FIG. 14 is a method flow diagram of a manufacturing method for a flexible display substrate provided in an embodiment of the present disclosure.

FIG. 15 is a method flow diagram of S104 in FIG. 14.

DETAILED DESCRIPTION OF THE EMBODIMENTS

Figure 1:
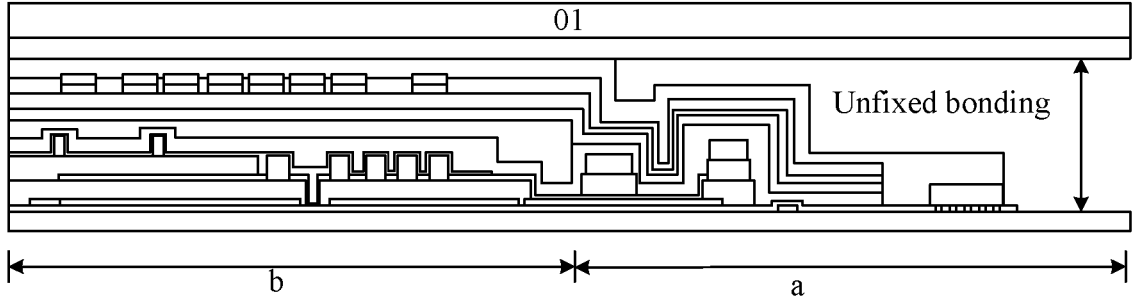
FIG. 1 is a schematic structural diagram of a section of an edge of a flexible display screen in the related art.
Figure 2:
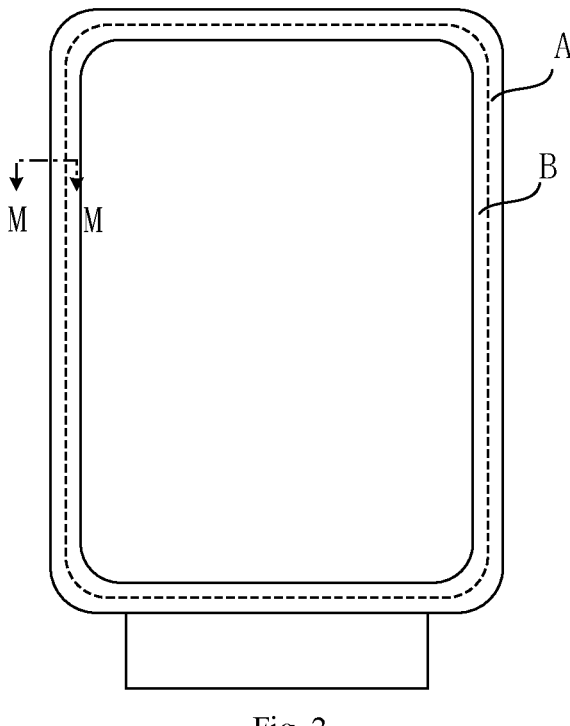
FIG. 2 is a schematic structural diagram of a top view of a flexible display substrate provided in an embodiment of the present disclosure.
Figure 3:
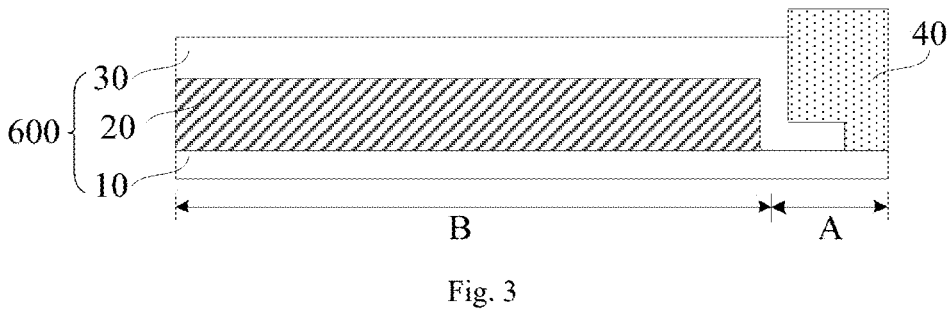
FIG. 3 is a schematic structural diagram of a section in direction MM in FIG. 2.

For making objectives, technical solutions and advantages of embodiments of the present disclosure clearer, the technical solutions of the embodiments of the present disclosure will be clearly and completely described below in conjunction with the accompanying drawings in the embodiments of the present disclosure. Apparently, the embodiments described are some rather than all of the embodiments of the present disclosure. The embodiments in the present disclosure and features of the embodiments can be combined with each other without conflict. Based on the embodiments of the present disclosure, all other embodiments obtained by those of ordinary skill in the art without making creative efforts fall within the scope of protection of the present disclosure.

Unless otherwise defined, technical or scientific terms used in the present disclosure should have ordinary meanings as understood by those of ordinary skill in the art to which the present disclosure belongs. "Include", "comprise", and other similar words used in the present disclosure indicate that elements or objects before the word include elements or objects after the word and their equivalents, without excluding other elements or objects.

It should be noted that a size and a shape of each figure in the drawings do not reflect a true scale, but only for illustrating the present disclosure. Throughout the drawings, identical or similar reference numerals denote identical or similar elements or elements having identical or similar functions.

In the related art, when a bonding radius is smaller, a four-sided curved display type flexible display screen with a larger angle has a higher requirement for bending resistance. At present, a conventional bonding radius is greater than or equal to 3.5 mm. When the bonding radius is reduced, for example, the bonding radius is 1.5 mm, an uppermost inorganic layer of a film packaging structure is likely to get broken, which causes invasion of water vapor and further leads to packaging failure. FIG. 1 shows a schematic structural diagram of a section of an edge of a flexible display screen in the related art. For example, area a has a segment difference of 10 μm-30 μm compared with area b. In a subsequent bonding process of a polarizer 01, etc., a thickness of the polarizer 01 is often 15 μm, which cannot effectively compensate for the segment difference of the area a, such that unfixed bonding between the polarizer 01 in the area a and a panel is caused. During subsequent bonding of a cover plate, it is highly likely to cause breakage of the film packaging structure in the area a due to extrusion deformation, and a crack even extends to the area b and then extends to an active area (AA), such that packaging failure may be caused and further an organic light-emitting diode (OLED) device may be damaged.

In view of this, embodiments of the present disclosure provide a flexible display substrate and a manufacturing method therefor, and a display apparatus, so as to prolong service life of the flexible display substrate.

The flexible display substrate includes:

a flexible substrate 10, a display function layer 20 at a side of the flexible substrate 10, a film packaging layer 30 at a side of the display function layer 20 facing away from the flexible substrate 10, and a leveling layer 40 at a side of the film packaging layer 30 facing away from the flexible substrate 10;

where the flexible substrate 10 includes a non-bending area B and a bending area A, the leveling layer 40 is at least located in the bending area A, and the leveling layer 40 is configured to compensate for a height difference between a related film layer structure 600 in the non-bending area B and a related film layer structure 600 in the bending area A.

In the flexible display substrate provided in the embodiments of the present disclosure, the leveling layer 40 is arranged at least in the bending area A, and the leveling layer 40 compensates for the height difference between the related film layer structure 600 in the non-bending area B and the related film layer structure 600 in the bending area A. On one hand, the leveling layer 40 effectively supports a subsequent film layer structure. On the other hand, the leveling layer 40 effectively protects the film packaging layer 30 in the bending area A. In this way, stress on the film packaging layer 30 when the flexible display substrate is bent is reduced, damage of the film packaging layer 30 due to excessive stress is avoided, failure of a display panel caused by invasion of water and oxygen due to the damage of the film packaging layer 30 is also avoided, and further service life of the flexible display substrate is prolonged.

In the flexible display substrate provided in the embodiments of the present disclosure, the leveling layer 40 is arranged at least in the bending area A, and the leveling layer 40 compensates for the height difference between the related film layer structure in the non-bending area B and the related film layer structure in the bending area A. On one hand, the leveling layer 40 effectively supports a subsequent film layer structure. On the other hand, the leveling layer 40 effectively protects the film packaging layer 30 in the bending area A. In this way, stress on the film packaging layer 30 when the flexible display substrate is bent is reduced, damage of the film packaging layer 30 due to excessive stress is avoided, failure of a display panel caused by invasion of water and oxygen due to the damage of the film packaging layer 30 is also avoided, and further service life of the flexible display substrate is prolonged.

It should be noted that the flexible display substrate of the embodiments of the present disclosure may be a foldable screen or a four-sided curved display type display screen, which is not limited herein. In the related drawings mentioned in the embodiments of the present disclosure, the flexible display substrate is used for the four-sided curved display type display screen, for example.

In some embodiments, the flexible substrate 10 may be made of a polyimide (PI) film, polyethylene terephthalate (PET), etc., which is not limited herein. The flexible substrate 10 may have a structure including a single flexible substrate layer, or a structure including a plurality of flexible substrate layers, for example, a structure including two flexible substrate layers, or a structure including three substrate layers, which is not limited herein. In addition, a barrier layer may be arranged between two adjacent flexible substrate layers.

The flexible display substrate includes the display function layer 20 at a side of the flexible substrate 10. The display function layer 20 may include an anode layer, an organic light-emitting layer and a cathode layer that are facing away from the flexible substrate 10 in sequence. The display function layer 20 may be manufactured through the prior art, which is not limited herein. When proper voltage is applied to the anode layer and the cathode layer, holes from the anode layer and charges from the cathode layer may be combined in the organic light-emitting layer, to generate light, such that a display function of the flexible display substrate is ensured.

The flexible display substrate further includes the film packaging layer 30 at a side of the display function layer 20 facing away from the flexible substrate 10, and the film packaging layer 30 is configured to package the display function layer 20 to prevent erosion of water and oxygen and avoid failure of the OLED device caused by the fact that the water and oxygen enter the display function layer 20. In addition, the film packaging layer 30 may include a first inorganic layer 301, an organic layer 302 and a second inorganic layer 303 that are facing away from the flexible substrate 10 in sequence, where the organic layer 302 is only located in the non-bending area B, and both the first inorganic layer 301 and the second inorganic layer 303 extend from the non-bending area B to the bending area A. The first inorganic layer 301 may be made of at least one of silicon oxide, silicon nitride and silicon oxynitride, the second inorganic layer 303 may be made of at least one of silicon oxide, silicon nitride and silicon oxynitride, and the organic layer 302 may be made of an organic material suitable for ink jet printing, which are not limited herein. Certainly, the film packaging layer 30 may further include more film layers in which inorganic layers and organic layers 302 are alternately arranged, which is not limited herein. It should be noted that an uppermost layer of the film packaging layer 30 is provided with an inorganic layer regardless of a structure of the film packaging layer 30, so as to effectively block water and oxygen.

The flexible display substrate further includes the leveling layer 40 at a side of the film packaging layer 30 facing away from the flexible substrate 10, and the leveling layer 40 is configured to compensate for the height difference between the related film layer structure in the non-bending area B and the related film layer structure in the bending area A, such that the segment difference between the non-bending area B and the bending area A caused by different arrangement of the film layer structures is avoided, the leveling layer 40 effectively protects the film packaging layer 30 in the bending area A, the stress on the film packaging layer 30 when the flexible display substrate is bent is reduced, the damage of the film packaging layer 30 due to the excessive stress is avoided, the failure of the display panel caused by invasion of the water and oxygen due to the damage of the film packaging layer 30 is also avoided, and further the service life of the flexible display substrate is prolonged. In addition, the leveling layer 40 additionally arranged may be manufactured through ink jet printing, glue dispensing, etc.

In the embodiments of the present disclosure, the flexible display substrate further includes a flexible multi-layer structure 50 (flexible multi-layer on cell, FMLOC) at a side of the film packaging layer 30 facing away from the flexible substrate 10. Accordingly, each film layer of the flexible multi-layer structure 50 may be directly manufactured on the film packaging layer 30, and accordingly, the flexible multi-layer structure 50 is arranged in the film layer structure, such that there is no need to additionally arrange a touch substrate. In this way, a touch function of the flexible display substrate is ensured while lightness and thinness design of the flexible display substrate is ensured. In some embodiments, the flexible multi-layer structure 50 may include a first metal layer 501, an insulating layer 502 and a second metal layer 503. The first metal layer 501 and the second metal layer 503 may be arranged in the same layer, or may be arranged facing away from the flexible substrate 10 in sequence and in different layers. Certainly, reference may be made to the description in the related art for specific arrangement of the flexible multi-layer structure 50, which is not described in detail herein. In addition, according to an arrangement position of the flexible multi-layer structure 50, there may be several implementation modes to arrange the leveling layer 40, which are not limited to the following implementation modes.

In an implementation mode, the leveling layer 40 is located at a side of the flexible multi-layer structure 50 facing away from the flexible substrate 10.

Figure 4:
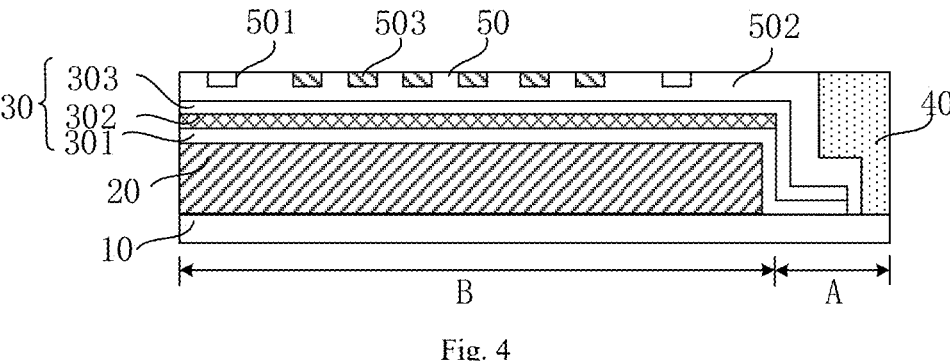
FIG. 4 is a schematic structural diagram of a section in direction MM in FIG. 2.

In some embodiments, FIG. 4 shows a schematic structural diagram of a flexible display substrate. The leveling layer 40 is only located in the bending area A, and a surface of a side of the leveling layer 40 facing away from the flexible substrate 10 is flush with a surface of a side of the flexible multi-layer structure 50 facing away from the flexible substrate 10 in the bending area A.

As shown in FIG. 4, the leveling layer 40 is only located in the bending area A, such that the lightness and thinness design of the flexible display substrate is ensured. In addition, the surface of a side of the leveling layer 40 facing away from the flexible substrate 10 is flush with the surface of a side of the flexible multi-layer structure 50 facing away from the flexible substrate 10 in the bending area A, such that the segment difference between the related film layer structure of the non-bending area B and the related film layer structure of the bending area A is effectively compensated for, breaking of the film packaging layer 30 is avoided, and the service life of the flexible display substrate is prolonged.

In the embodiments shown in FIG. 4, the leveling layer 40 is made of cured ultraviolet (UV) curing adhesive or thermocuring adhesive. In some embodiments, uncured adhesive may be coated to a side of the flexible multi-layer structure 50 facing away from the flexible substrate 10 through ink jetting, and cured adhesive forms the leveling layer 40, such that a manufacturing process of the leveling layer 40 is simplified. In this way, the lightness and thinness design of the flexible display substrate is ensured while cost of the flexible display substrate is reduced. In some embodiments, a buffer layer 500 is further arranged between the flexible multi-layer structure 50 and the film packaging layer 30. The buffer layer 500 is arranged at a side of the second inorganic layer 303 facing away from the flexible substrate 10, such that structural stability of the flexible multi-layer structure 50 arranged then is ensured.

In some embodiments, the flexible display substrate shown in FIG. 4 may be manufactured through the following manufacturing method, which includes the following steps.

(1) A driving circuit layer is manufactured on a flexible substrate 10, and a display function layer 20 is manufactured on the driving circuit layer, where the display function layer 20 includes an anode layer, an organic light-emitting layer and a cathode layer.

(2) A first inorganic layer 301 is deposited on the display function layer 20 through vacuum deposition, vapor deposition or spin coating.

(3) An organic layer 302 is printed on a side of the first inorganic layer 301 facing away from the flexible substrate 10 through an ink jet printing process.

(4) A second inorganic layer 303 is deposited on the organic layer 302, and accordingly, the first inorganic layer 301, the organic layer 302 and the second inorganic layer 303 constitute a film packaging layer 30.

(5) A first metal layer 501, an insulating layer 502 and a second metal layer 503 are manufactured on the second inorganic layer 303, and accordingly, the first metal layer 501, the insulating layer 502 and the second metal layer 503 constitute a flexible multi-layer structure 50.

(6) A leveling layer 40 is coated on a side of the flexible multi-layer structure 50 facing away from the flexible substrate 10, the leveling layer 40 is only located in a bending area A, and a surface of a side of the leveling layer 40 facing away from the flexible substrate 10 is flush with a surface of a side of the flexible multi-layer structure 50 facing away from the flexible substrate 10 in the bending area A.

Figure 5:
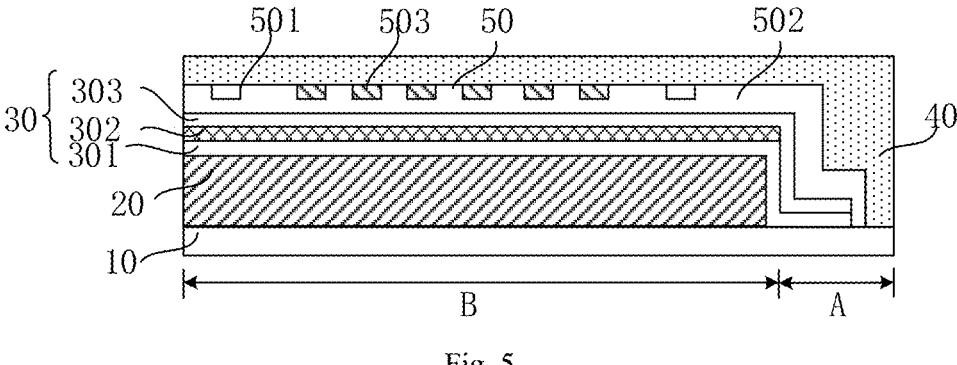
FIG. 5 is a schematic structural diagram of a section in direction MM in FIG. 2.

In some embodiments, FIG. 5 shows a schematic structural diagram of a flexible display substrate. The leveling layer 40 is located in both the non-bending area B and the bending area A, and a surface of a side of the leveling layer 40 facing away from the flexible substrate 10 in the non-bending area B is flush with a surface of a side of the leveling layer 40 facing away from the flexible substrate 10 in the bending area A.

As shown in FIG. 5, the leveling layer 40 is located in both the non-bending area B and the bending area A. In some embodiments, after the display function layer 20, the film packaging layer 30 and the flexible multi-layer structure 50 are manufactured on the flexible substrate 10 in sequence, the leveling layer 40 may be bonded to a whole layer of the side of the flexible multi-layer structure 50 facing away from the flexible substrate 10, such that a manufacturing process of compensating for the segment difference of the bending area A via the leveling layer 40 is simplified. In addition, the surface of the side of the leveling layer 40 facing away from the flexible substrate 10 in the non-bending area B is flush with the surface of the side of the leveling layer 40 facing away from the flexible substrate 10 in the bending area A. In this way, flatness of the related film layer structures arranged at the side of the leveling layer 40 facing away from the flexible substrate 10 is ensured, and usability of the flexible display substrate is ensured.

In the embodiments shown in FIG. 5, the leveling layer 40 is made of cured transparent optical adhesive, such that it is ensured that the leveling layer 40 may effectively compensate for the segment difference of the bending area A without influencing the display function of the flexible display substrate, and further the usability of the flexible display substrate is improved.

In the embodiments shown in FIGS. 4 and 5, a modulus of the cured leveling layer 40 is greater than 100 Mpa. The leveling layer 40 not only effectively supports the subsequent film layer structure, but effectively protects the film packaging layer 30 in the bending process, such that breaking of the film packaging layer 30 may be avoided, and the usability of the flexible display substrate may be improved.

In some embodiments, the flexible display substrate shown in FIG. 5 may be manufactured through the following manufacturing method, which includes the following steps.

(1) A driving circuit layer is manufactured on a flexible substrate 10, and a display function layer 20 is manufactured on the driving circuit layer, where the display function layer 20 includes an anode layer, an organic light-emitting layer and a cathode layer.

(2) A first inorganic layer 301 is deposited on the display function layer 20 through vacuum deposition, vapor deposition or spin coating.

(3) An organic layer 302 is printed on a side of the first inorganic layer 301 facing away from the flexible substrate 10 through an ink jet printing process.

(4) A second inorganic layer 303 is deposited on the organic layer 302, and accordingly, the first inorganic layer 301, the organic layer 302 and the second inorganic layer 303 constitute a film packaging layer 30.

(5) A first metal layer 501, an insulating layer 502 and a second metal layer 503 are manufactured on the second inorganic layer 303, and accordingly, the first metal layer 501, the insulating layer 502 and the second metal layer 503 constitute a flexible multi-layer structure 50.

(6) A leveling layer 40 is coated on a side of the flexible multi-layer structure 50 facing away from the flexible substrate 10, the leveling layer 40 is located in both a non-bending area B and a bending area A, and a surface of a side of the leveling layer 40 facing away from the flexible substrate 10 in the non-bending area B is flush with a surface of a side of the leveling layer 40 facing away from the flexible substrate 10 in the bending area A.

In some embodiments, the flexible display substrate further includes: a flexible multi-layer structure 50 at a side of the film packaging layer 30 facing away from the flexible substrate 10, where the leveling layer 40 is disposed between the flexible multi-layer structure 50 and the film packaging layer 30.

Figure 6:
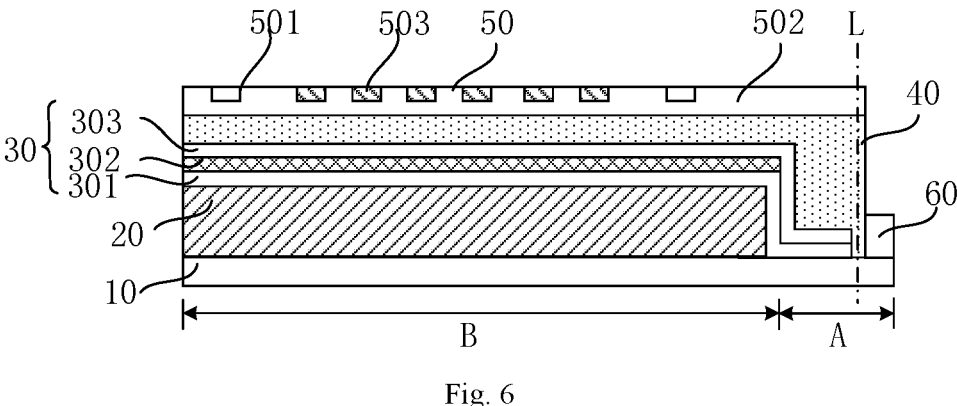
FIG. 6 is a schematic structural diagram of a section in direction MM in FIG. 2.

In some embodiments, FIG. 6 shows a schematic structural diagram of a flexible display substrate. The leveling layer 40 is located in both the non-bending area B and the bending area A, and the surface of the side of the leveling layer 40 facing away from the flexible substrate 10 in the non-bending area B is flush with the surface of the side of the leveling layer 40 facing away from the flexible substrate 10 in the bending area A.

As shown in FIG. 6, the leveling layer 40 is located in both the non-bending area B and the bending area A. In some embodiments, after the display function layer 20 and the flexible multi-layer structure 50 are manufactured on the flexible substrate 10 in sequence, the whole leveling layer 40 may be printed on the side of the flexible multi-layer structure 50 facing away from the flexible substrate 10 through ink jetting, such that a manufacturing process of compensating for the segment difference of the bending area A via the leveling layer 40 is simplified. In addition, the surface of the side of the leveling layer 40 facing away from the flexible substrate 10 in the non-bending area B is flush with the surface of the side of the leveling layer 40 facing away from the flexible substrate 10 in the bending area A. In this way, flatness of the related film layer structures arranged at the side of the leveling layer 40 facing away from the flexible substrate 10 is ensured, and usability of the flexible display substrate is ensured.

In the embodiments shown in FIG. 6, the leveling layer 40 is made of an organic film packaging material. In some embodiments, the leveling layer 40 may be made of the same material as or different material from the organic layer 302 in the film packaging layer 30, which is not limited herein.

In some embodiments, the flexible display substrate shown in FIG. 6 may be manufactured through the following manufacturing method, which includes the following steps.

(1) A driving circuit layer is manufactured on a flexible substrate 10, and a display function layer 20 is manufactured on the driving circuit layer, where the display function layer 20 includes an anode layer, an organic light-emitting layer and a cathode layer.

(2) A first inorganic layer 301 is deposited on the display function layer 20 through vacuum deposition, vapor deposition or spin coating.

(3) An organic layer 302 is printed on a side of the first inorganic layer 301 facing away from the flexible substrate 10 through an ink jet printing process.

(4) A second inorganic layer 303 is deposited on the organic layer 302, and accordingly, the first inorganic layer 301, the organic layer 302 and the second inorganic layer 303 constitute a film packaging layer 30.

(5) An ink jet printing process is used to print the organic film packaging material on a side of the second inorganic layer 303 facing away from the flexible substrate 10, accordingly, the leveling layer 40 is made of the organic film packaging material, the leveling layer 40 is located in both a non-bending area B and a bending area A, and a surface of a side of the leveling layer 40 facing away from the flexible substrate 10 in the non-bending area B is flush with a surface of a side of the leveling layer 40 facing away from the flexible substrate 10 in the bending area A.

(6) A first metal layer 501, an insulating layer 502 and a second metal layer 503 are manufactured on the film packaging layer 30, and accordingly, the first metal layer 501, the insulating layer 502 and the second metal layer 503 constitute a flexible multi-layer structure 50.

In the embodiments of the present disclosure, as shown in FIG. 6, the flexible display substrate further includes: a barrier dam 60 at a side of the leveling layer 40 facing away from the display function layer 20, where the barrier dam 60 is arranged around the leveling layer 40.

Figure 7:
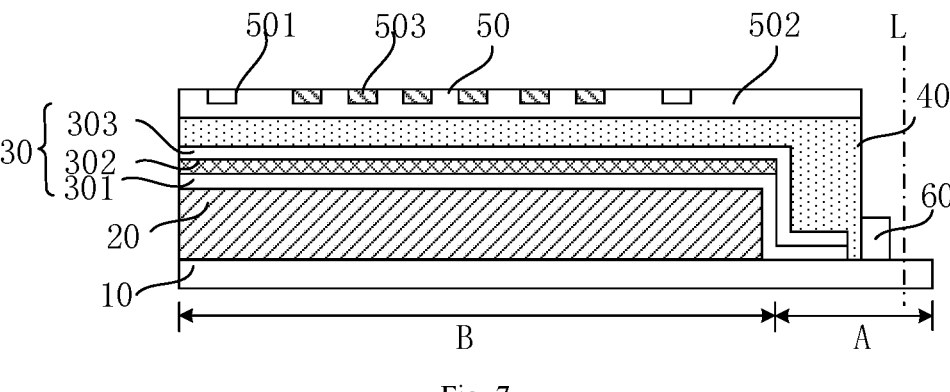
FIG. 7 is a schematic structural diagram of a section in direction MM in FIG. 2.

In the embodiments of the present disclosure, the barrier dam 60 may be arranged according to the structure shown in FIG. 7 in addition to the structure shown in FIG. 6. An edge of a side of the bending area A away from the non-bending area B is provided with a cutting path; and the leveling layer 40 fills the cutting path, and alternatively, the leveling layer 40 does not cover the cutting path.

In some embodiments, the edge of the side of the bending area A away from the non-bending area B is provided with the cutting path. As shown in FIG. 6, the leveling layer 40 may fill the cutting path, where a dotted line L represents the cutting path. As shown in FIG. 7, the leveling layer 40 also may not cover the cutting path. In a subsequent manufacturing process, the flexible display substrate may be cut along the cutting path, so as to obtain a substrate for manufacturing a display apparatus. In addition, by using the structure shown in FIG. 7, a problem of carbonization of the organic layer 302 near the cutting path during cutting is avoided, and the usability of the flexible display substrate is improved accordingly.

It should be noted that the flexible display substrate may include a detection wiring layer 201, a driving circuit layer 202, a planarization (PLN) layer 203, a post spacer (PS) 204, a photo define layer (PDL) 205, etc., in addition to the film layer structures mentioned above. The detection wiring layer 201 may be wiring for detecting cracks around the flexible display substrate, and for example, the detection wiring layer 201 may be panel crack detection (PCD) wiring. An existing manufacturing process may be used to manufacture the related film layer structures, which is not limited herein. The barrier dam 60 may be composed of the PLN, the PDL and the PS, and an extension length of the barrier dam in a direction of the non-bending area B to the bending area A is 20 μm-100 μm. In addition, the flexible display substrate in the embodiments of the present disclosure includes the film layer structures mentioned above, and may further arrange other film layer structures according to actual application needs. Reference may be made to specific arrangement in the related art for a specific arrangement situation, which is not described in detail herein.

In the embodiments of the present disclosure, the flexible display substrate further includes a first barrier dam 70 in the bending area A, and the first barrier dam 70 is arranged around an edge of the organic layer 302 of the film packaging layer 30. The flexible display substrate further includes a second barrier dam 80 located in the bending area A and arranged at a side of the first barrier dam 70 facing away from the non-bending area B, and the second barrier dam 80 is arranged around an edge of the display function layer 20, and may be arranged around an edge of the anode layer. The barrier dam is configured to bar the leveling layer 40 from flowing out of the bending area A; the first barrier dam 70 is configured to bar the organic layer 302 from flowing into the bending area A from the non-bending area B; and the second barrier dam 80 is configured to bar the organic layer 302 from flowing out of an area covered by the first inorganic layer 301 and the second inorganic layer 303.

In addition, the barrier dam 60, the first barrier dam 70 and the second barrier dam 80 may be manufactured in the same layer, such that the manufacturing process of the flexible display substrate is simplified while the usability of the flexible display substrate is ensured.

Figure 8:
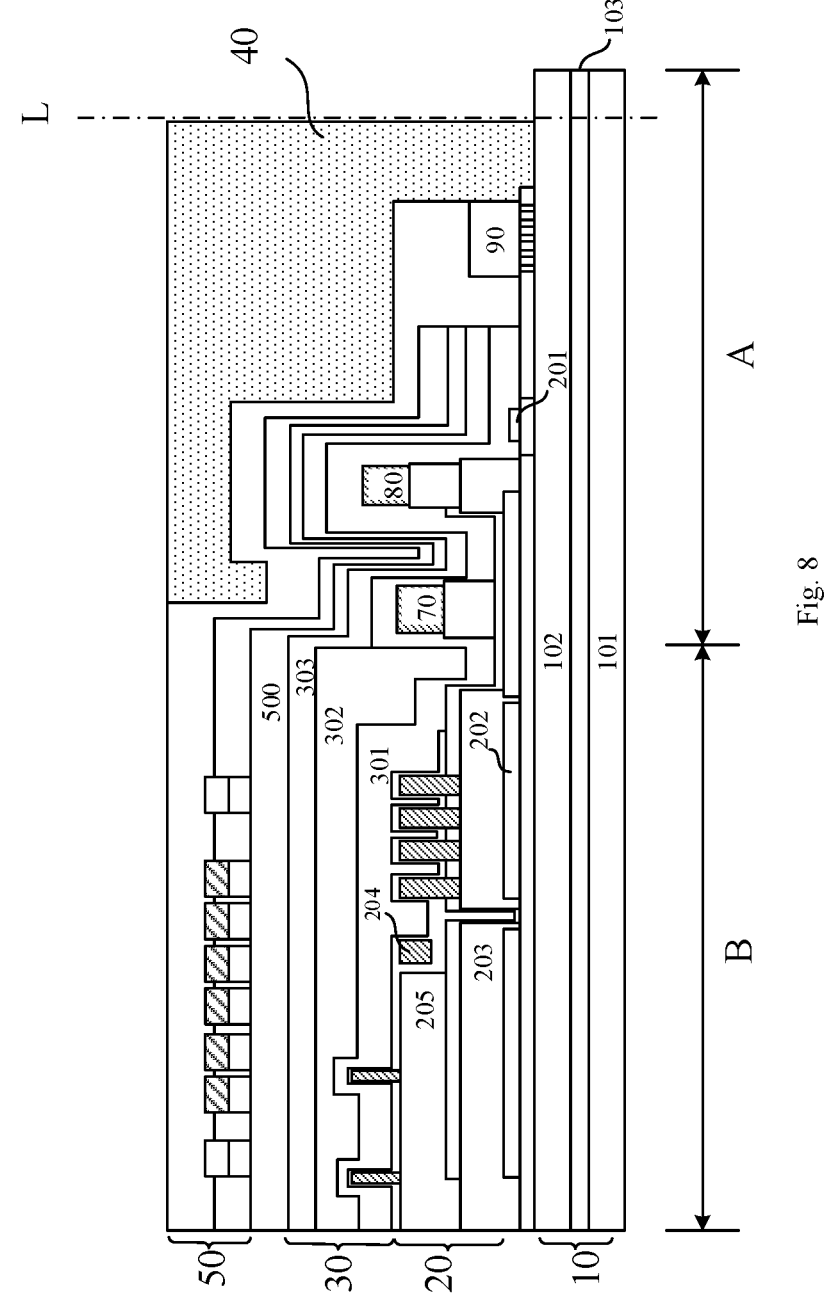
FIG. 8 is a schematic structural diagram of a section in direction MM in FIG. 2.
Figure 9:
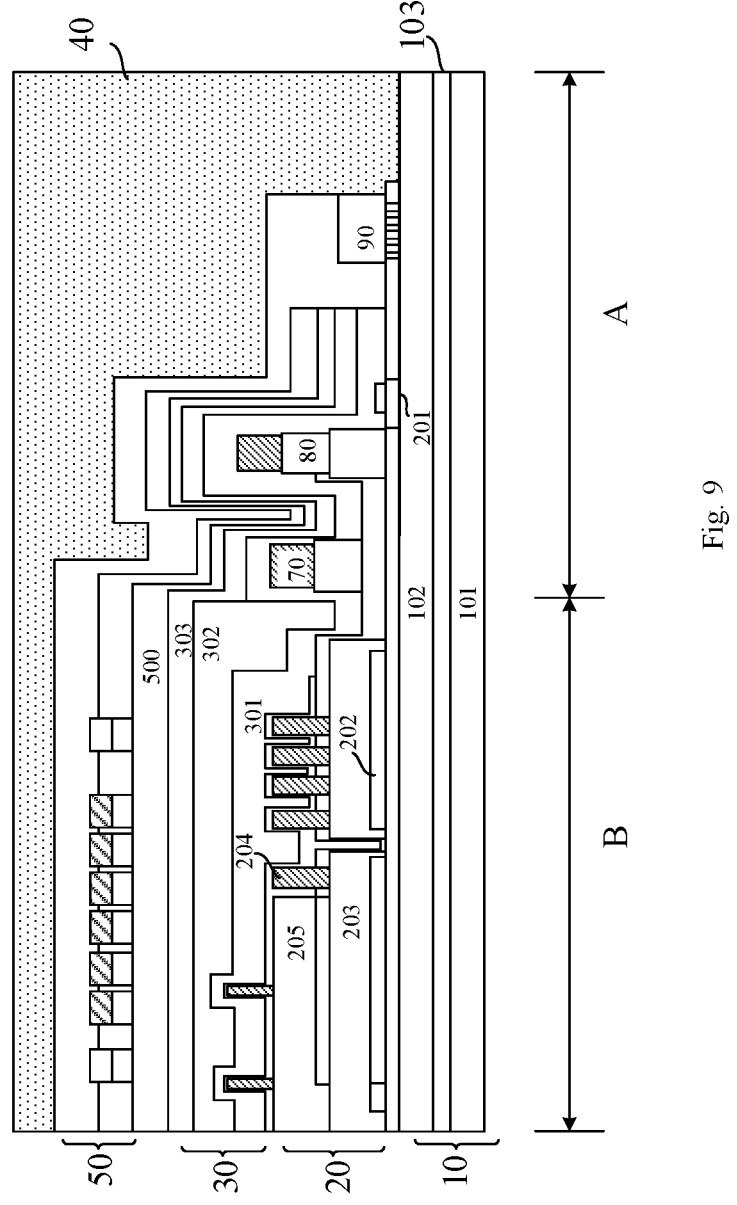
FIG. 9 is a schematic structural diagram of a section in direction MM in FIG. 2.
Figure 10:
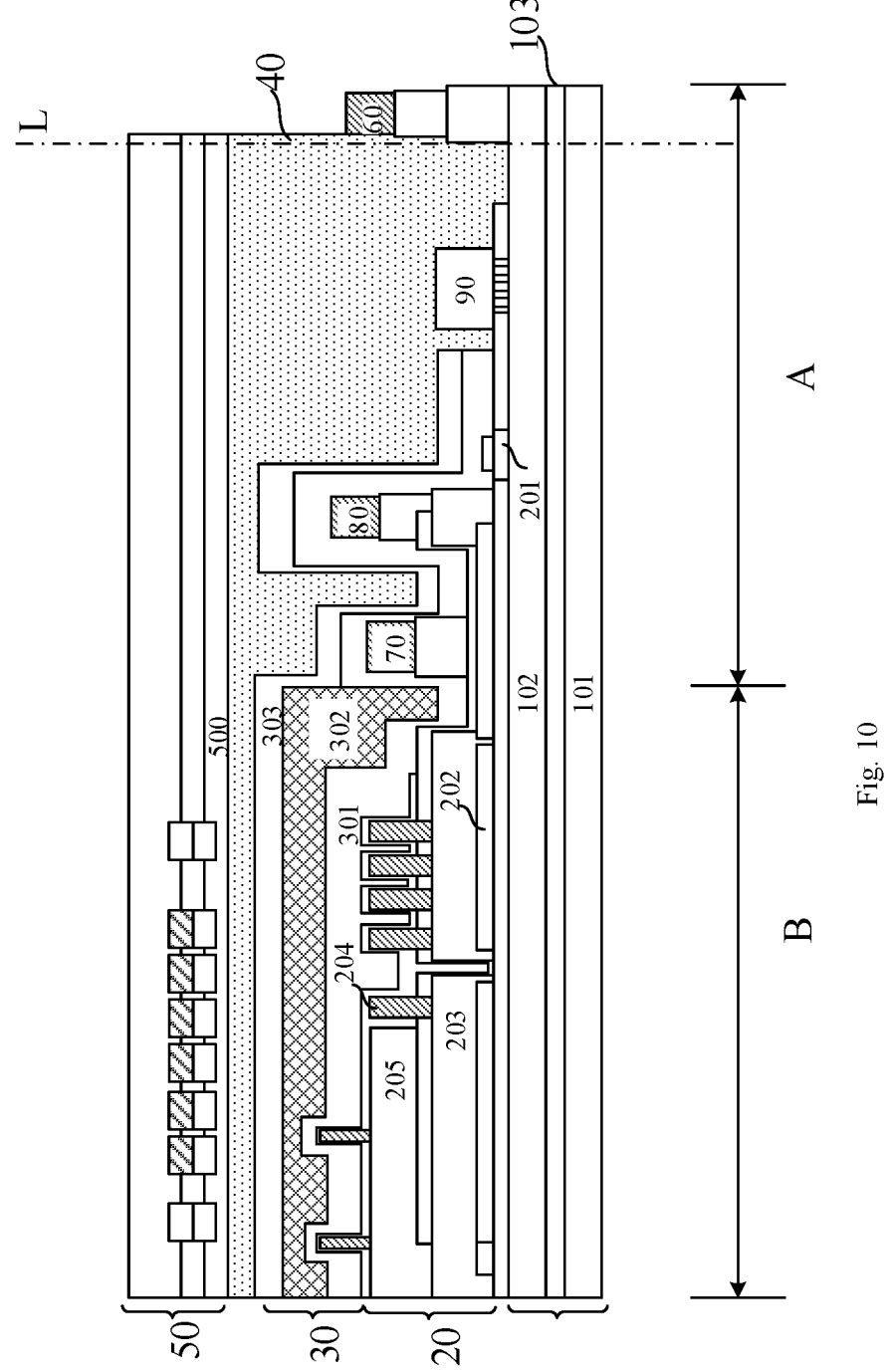
FIG. 10 is a schematic structural diagram of a section in direction MM in FIG. 2.
Figure 11:
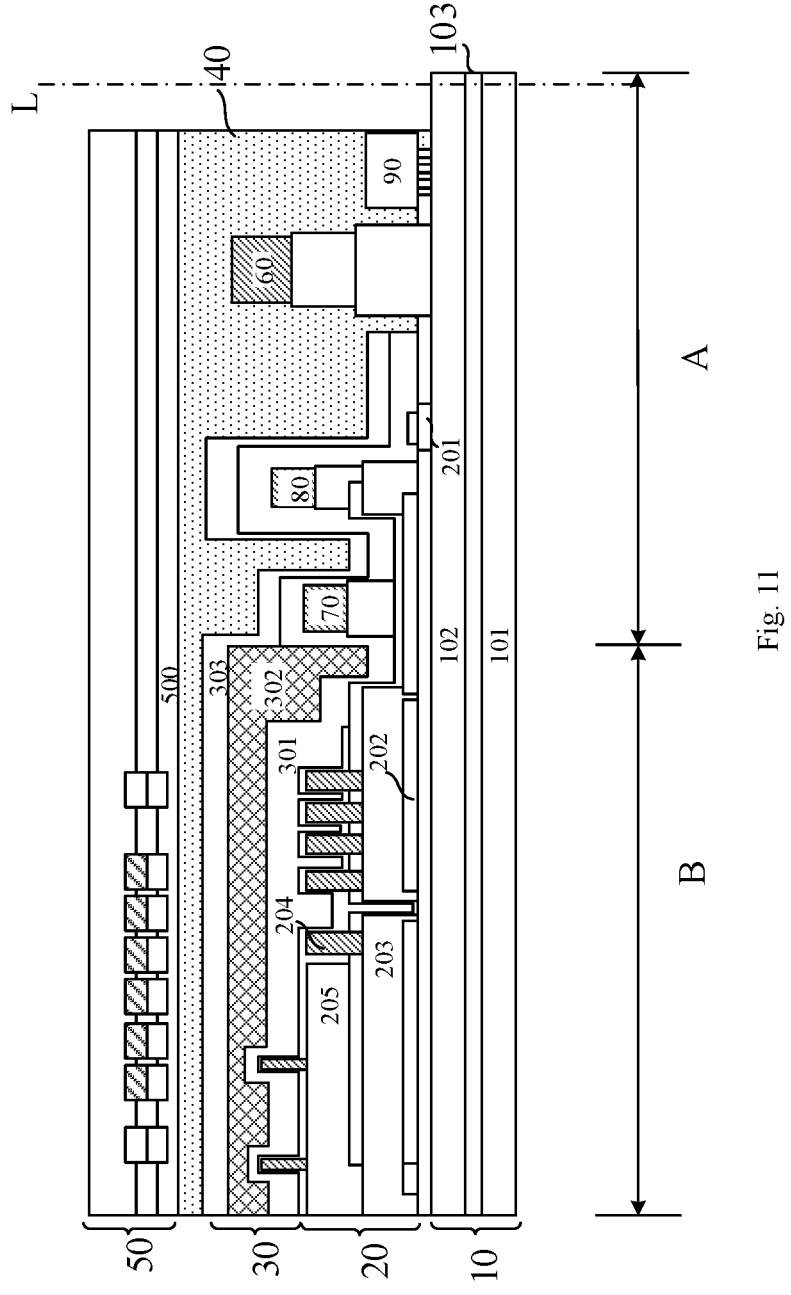
FIG. 11 is a schematic structural diagram of a section in direction MM in FIG. 2.

In some embodiments of the present disclosure, the flexible substrate 10 includes a first flexible substrate layer 101, a second flexible substrate layer 102, and a barrier layer 103 between the first flexible substrate layer 101 and the second flexible substrate layer 102. In the embodiments, if the flexible display substrate includes the related film layer structures mentioned above, a schematic diagram of a specific structure of the flexible display substrate shown in FIG. 4 may be as shown in FIG. 8, a schematic diagram of a specific structure of the flexible display substrate shown in FIG. 5 may be as shown in FIG. 9, a schematic diagram of a specific structure of the flexible display substrate shown in FIG. 6 may be as shown in FIG. 10, and a schematic diagram of a specific structure of the flexible display substrate shown in FIG. 7 may be as shown in FIG. 11. Certainly, other film layer structures in the flexible display substrate may be further arranged according to actual application needs, which are not described in detail herein.

In the embodiments of the present disclosure, as shown in FIGS. 10 and 11, the flexible display substrate further includes: a third barrier dam 90 located in the bending area A and arranged at a side of the second barrier dam 80 close to the cutting path, and the third barrier dam 90 is arranged around edges of the first inorganic layer 301 and the second inorganic layer 303. In this way, in a process of cutting the flexible display substrate along the cutting path, the third barrier dam 90 may bar a cutting crack from extending from the bending area A to the non-bending area B, or even to an active area, such that the usability of the flexible display substrate is improved.

In the embodiments of the present disclosure, in addition to cutting the flexible display substrate along the cutting path, the flexible substrate may be etched along the cutting path. In some embodiments, for an upper frame and left and right frames of the flexible display substrate, the flexible display substrate may be cut along the cutting path. For a lower frame of the flexible display substrate, due to existence of related driving circuits, the flexible display substrate may be etched along the cutting path. In addition, reference may be made to the description in the related art for the specific implementation processes of cutting and etching, which are not described in detail herein.

Figure 12:
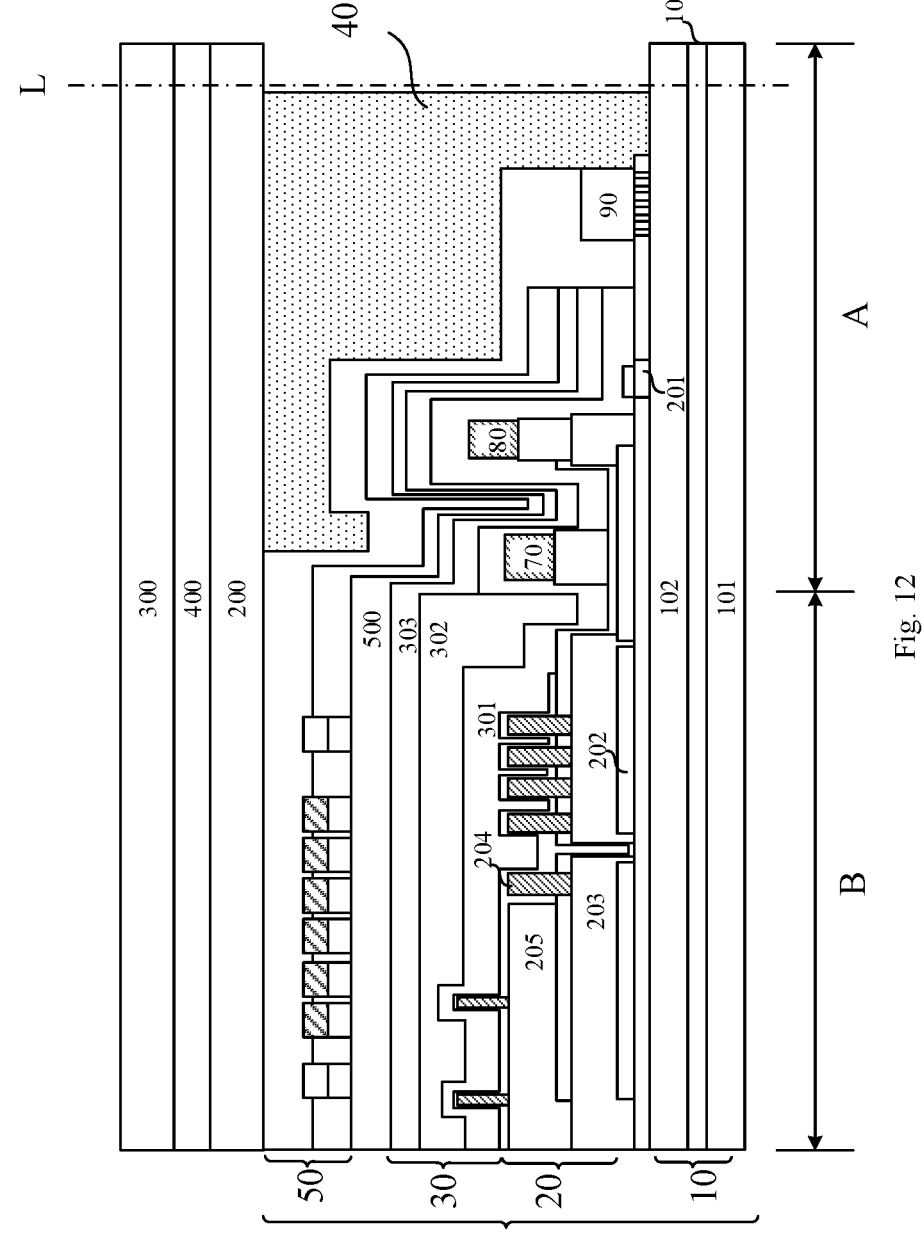
FIG. 12 is a schematic structural diagram of a display apparatus provided in an embodiment of the present disclosure.

Based on the same disclosed concept, as shown in FIG. 12, the embodiments of the present disclosure further provides a display apparatus. A problem solving principle of the display apparatus is similar to that of the flexible display substrate 100 mentioned above, so reference may be made to implementation of the flexible display substrate 100 mentioned above for implementation of the display apparatus, which is not repeated herein.

In some embodiments, the display apparatus provided in the embodiments of the present disclosure may be a mobile phone, or any product or component with a display function, such as a tablet computer, a television, a display screen, a notebook computer, a digital photo frame and a navigator. Other essential components of the display apparatus should be understood by those of ordinary skill in the art, which are not repeated herein and should not limit the present disclosure.

As shown in FIG. 12, the display apparatus further includes: a filter layer 200 on the flexible display substrate.

In some embodiments, the filter layer 200 is a polarizer or a color filter.

In some embodiments, in the flexible display substrate provided in the embodiments of the present disclosure, the filter layer 200 may be a polarizer or a color filter. A thickness of the polarizer is generally high. When the color filter is used as the filter layer 200, that is, a color filter on encapsulation (COE) technology is used, and accordingly, lightness and thinness design of the display apparatus is ensured.

In the embodiments of the present disclosure, the display apparatus further includes: a protective cover plate 300 at a side of the filter layer 200 facing away from the flexible substrate.

If the display apparatus uses the flexible display substrate as shown in FIG. 8, the filter layer 200 may be bonded to the side of the leveling layer facing away from the flexible substrate, and an adhesive layer 400 may be arranged on the filter layer 200; and the protective cover plate 300 may be further bonded to the filter layer 200 via the adhesive layer 400 on the filter layer 200, to form the display apparatus as shown in FIG. 12.

Figure 13:
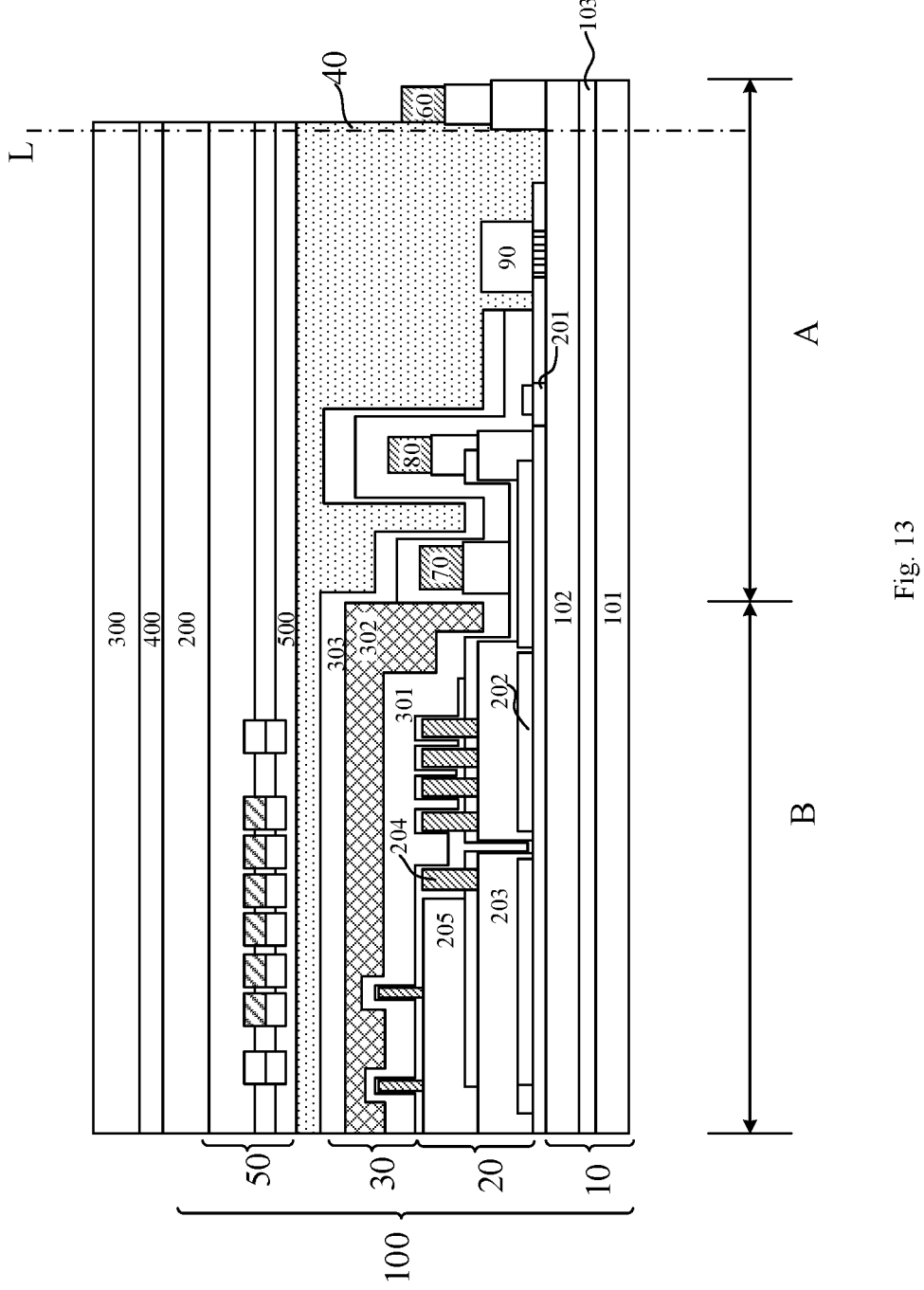
FIG. 13 is a schematic structural diagram of a display apparatus provided in an embodiment of the present disclosure.

If the display apparatus uses the flexible display substrate as shown in FIG. 10, the filter layer 200 may be bonded to the side of a flexible multi-layer structure facing away from the flexible substrate, and an adhesive layer 400 may be arranged on the filter layer 200; and the protective cover plate 300 may be further bonded to the filter layer 200 via the adhesive layer 400 on the filter layer 200, to form the display apparatus as shown in FIG. 13.

Based on the same disclosed concept, the embodiments of the present disclosure further provide a manufacturing method for the flexible display substrate mentioned above. As shown in FIG. 14, the method includes the following steps.

S101: providing a flexible substrate, where the flexible substrate includes a non-bending area and a bending area.

S102: forming a display function layer at a side of the flexible substrate.

S103: forming a film packaging layer at a side of the display function layer facing away from the flexible substrate.

S104: forming a leveling layer at a side of the film packaging layer facing away from the flexible substrate, where the leveling layer is at least located in the bending area, and the leveling layer is configured to compensate for a height difference between a related film layer structure in the non-bending area and a related film layer structure in the bending area.

In some embodiments, reference may be made to the description of related parts in the flexible display substrate mentioned above for a specific implementation process of S101 to S104, which is not repeated herein.

In some embodiments, as shown in FIG. 15, in the manufacturing method for flexible display substrates as shown in FIGS. 4 and 5, S104 that a leveling layer is formed at the side of the film packaging layer facing away from the flexible substrate includes the following steps.

S201: forming a flexible multi-layer structure is at a side of the film packaging layer facing away from the flexible substrate.

S202: coating the leveling layer on a side of the flexible multi-layer structure facing away from the flexible substrate.

Reference may be made to the related description of a manufacturing method for the leveling layer in the flexible display substrate mentioned above for a specific implementation process of S201 to S202, which is not repeated herein.

In a second implementation mode, in the manufacturing method for a flexible display substrate as shown in FIG. 6, S104 that a leveling layer is formed at the side of the film packaging layer facing away from the flexible substrate includes the following step:

an ink jet printing process is used to print an organic film packaging material on the side of the film packaging layer facing away from the flexible substrate, to form the leveling layer, where the leveling layer is located in both the non-bending area and the bending area, and the surface of the side of the leveling layer facing away from the flexible substrate in the non-bending area is flush with the surface of the side of the leveling layer facing away from the flexible substrate in the bending area.

Accordingly, reference may be made to the related description of the manufacturing method for the leveling layer in the flexible display substrate mentioned above for the manufacturing method for the leveling layer in the flexible display substrate shown in FIG. 6, which is not repeated herein.

Although preferred embodiments of the present disclosure have been described, those skilled in the art can make additional changes and modifications to the embodiments once they learn the basic inventive concept. Therefore, the appended claims are intended to be interpreted as including the preferred embodiments and all changes and modifications falling within the scope of the present disclosure.

Apparently, those skilled in the art can make various modifications and variations to the present disclosure without departing from the spirit and scope of the present disclosure. In this way, if the modifications and variations of the present disclosure fall within the scope of the claims of the present disclosure and their equivalent technologies, the present disclosure is also intended to include the modifications and variations.

What is claimed is:

1. A flexible display substrate, comprising:
a flexible substrate;
a display function layer at a side of the flexible substrate;
a film packaging layer at a side of the display function layer facing away from the flexible substrate; and,
a leveling layer at a side of the film packaging layer facing away from the flexible substrate;
wherein the flexible substrate comprises a non-bending area and a bending area, the leveling layer is at least located in the bending area, and the leveling layer is configured to compensate for a height difference between a related film layer structure in the non-bending area and a related film layer structure in the bending area; the related film layer structure in the non-bending area comprises the flexible substrate, the display function layer and the film packaging layer, and the related film layer structure in the bending area comprises the flexible substrate and the film packaging layer;
wherein the flexible display substrate further comprises:
a flexible multi-layer structure at a side of the film packaging layer facing away from the flexible substrate; wherein the leveling layer is located at a side of the flexible multi-layer structure facing away from the flexible substrate, and the flexible multi-layer structure is used to implement a touch function of the flexible display substrate; wherein the flexible multi-layer structure comprises a first metal layer, an insulating layer and a second metal layer;

14 wherein the leveling layer is only located in the bending area, and a surface of a side of the leveling layer facing away from the flexible substrate is flush with a surface of a side of the flexible multi-layer structure facing away from the flexible substrate in the bending area.

2. The flexible display substrate according to claim 1, wherein the leveling layer is made of cured ultraviolet (UV) curing adhesive or thermocuring adhesive.

3. The flexible display substrate according to claim 1, wherein the leveling layer is made of cured transparent optical adhesive.

4. The flexible display substrate according to claim 2, wherein a modulus of the leveling layer after curing is greater than 100 Mpa.

5. A display apparatus, comprising the flexible display substrate according to claim 1.

6. The display apparatus according to claim 5, further comprising:
a filter layer on the flexible display substrate.

7. The display apparatus according to claim 6, wherein the filter layer is a polarizer or a color filter.

8. A manufacturing method for the flexible display substrate according to claim 1, comprising:
providing the flexible substrate, wherein the flexible substrate comprises the non-bending area and the bending area;
forming the display function layer at the side of the flexible substrate;
forming the film packaging layer at the side of the display function layer facing away from the flexible substrate; and
forming the leveling layer at a side of the film packaging layer facing away from the flexible substrate;
wherein the leveling layer is at least located in the bending area, and the leveling layer is configured to compensate for the height difference between the related film layer structure in the non-bending area and the related film layer structure in the bending area; the related film layer structure in the non-bending area comprises the flexible substrate, the display function layer and the film packaging layer, and the related film layer structure in the bending area comprises the flexible substrate and the film packaging layer.

9. The method according to claim 8, wherein the forming the leveling layer at the side of the film packaging layer facing away from the flexible substrate comprises:
forming a flexible multi-layer structure at a side of the film packaging layer facing away from the flexible substrate; and
coating the leveling layer on a side of the flexible multi-layer structure facing away from the flexible substrate.

10. The method according to claim 8, wherein the forming the leveling layer at the side of the film packaging layer facing away from the flexible substrate comprises:
printing an organic film packaging material on a side of the film packaging layer facing away from the flexible substrate by using an ink jet printing process, to form the leveling layer.

11. A flexible display substrate, comprising:
a flexible substrate;
a display function layer at a side of the flexible substrate;
a film packaging layer at a side of the display function layer facing away from the flexible substrate; and,
a leveling layer at a side of the film packaging layer facing away from the flexible substrate;

wherein the flexible substrate comprises a non-bending area and a bending area, the leveling layer is at least located in the bending area, and the leveling layer is configured to compensate for a height difference between a related film layer structure in the non-bending area and a related film layer structure in the bending area; the related film layer structure in the non-bending area comprises the flexible substrate, the display function layer and the film packaging layer, and the related film layer structure in the bending area comprises the flexible substrate and the film packaging layer;

wherein the flexible display substrate further comprises:

a flexible multi-layer structure at a side of the film packaging layer facing away from the flexible substrate; wherein the leveling layer is located at a side of the flexible multi-layer structure facing away from the flexible substrate, and the flexible multi-layer structure is used to implement a touch function of the flexible display substrate: wherein the flexible multi-layer structure comprises a first metal layer, an insulating layer and a second metal layer.

12. A flexible display substrate, comprising:

a flexible substrate;

a display function layer at a side of the flexible substrate;

a film packaging layer at a side of the display function layer facing away from the flexible substrate; and, a leveling layer at a side of the film packaging layer facing away from the flexible substrate;

wherein the flexible substrate comprises a non-bending area and a bending area, the leveling layer is at least located in the bending area, and the leveling layer is configured to compensate for a height difference between a related film layer structure in the non-bending area and a related film layer structure in the bending area; the related film layer structure in the non-bending area comprises the flexible substrate, the display function layer and the film packaging layer, and the related film layer structure in the bending area comprises the flexible substrate and the film packaging layer;

wherein the flexible display substrate further comprises:

a flexible multi-layer structure at a side of the film packaging layer facing away from the flexible substrate, wherein the leveling layer is disposed between the flexible multi-layer structure and the film packaging layer, the flexible multi-layer structure is used to implement a touch function of the flexible display substrate, and the flexible multi-layer structure comprises a first metal layer, an insulating layer and a second metal layer; wherein the leveling layer is located in both the non-bending area and the bending area, and a surface of a side of the leveling layer facing away from the flexible substrate in the non-bending area is flush with a surface of a side of the leveling layer facing away from the flexible substrate in the bending area; wherein the leveling layer is made of an organic film packaging material;

a barrier dam at a side of the leveling layer facing away from the display function layer, wherein the barrier dam is arranged around the leveling layer.

* * * * *